United States Patent
Ko (10) Patent No.: US 9,183,919 B2
(45) Date of Patent: Nov. 10, 2015

(54) SEMICONDUCTOR DEVICE

(71) Applicant: SK hynix Inc., Gyeonggi-do (KR)

(72) Inventor: Jae-Bum Ko, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/303,123

(22) Filed: Jun. 12, 2014

(65) Prior Publication Data

US 2015/0206571 A1 Jul. 23, 2015

(30) Foreign Application Priority Data

Jan. 20, 2014 (KR) .................. 10-2014-0006563

(51) Int. Cl.
*G11C 11/40* (2006.01)
*G11C 11/406* (2006.01)

(52) U.S. Cl.
CPC ........ *G11C 11/406* (2013.01); *G11C 11/40618* (2013.01); *G11C 2211/4063* (2013.01)

(58) Field of Classification Search
CPC ........... G11C 11/406; G11C 11/40618; G11C 2211/4063
See application file for complete search history.

(56) References Cited

U.S. PATENT DOCUMENTS

| | | | | |
|---|---|---|---|---|
| 4,887,240 A * | 12/1989 | Garverick et al. | ............ | 365/222 |
| 7,203,115 B2 * | 4/2007 | Eto | ................. | 365/222 |
| 7,260,009 B2 * | 8/2007 | Origasa | ............... | 365/222 |
| 7,260,010 B2 * | 8/2007 | Kwak et al. | .................... | 365/222 |
| 8,284,615 B2 * | 10/2012 | Shim | ........................ | 365/185.25 |

FOREIGN PATENT DOCUMENTS

KR 1020130117424 10/2013

* cited by examiner

*Primary Examiner* — Vanthu Nguyen
(74) *Attorney, Agent, or Firm* — IP & T Group LLP (57) ABSTRACT

A semiconductor device including an operation initiation block suitable for sequentially generating a plurality of operation initiation signals at a predetermined time interval in response to an operation initiation source signal, a clock-based signal generation block suitable for generating an operation termination source signal in response to one of the multiple operation initiation signals and a clock, an operation termination block suitable for sequentially generating a plurality of operation termination signals at the predetermined time interval in response to the operation termination source signal, and an operation control block suitable for sequentially generating a plurality of first operation control signals in response to the multiple operation initiation signals and the multiple operation termination signals.

19 Claims, 11 Drawing Sheets

SEMICONDUCTOR DEVICE

CROSS-REFERENCE TO RELATED APPLICATIONS

The present application claims priority of Korean Patent Application No. 10-2014-0006563, filed on Jan. 20, 2014, which is incorporated herein by reference in its entirety.

BACKGROUND

1. Field

Exemplary embodiments of the present invention relate to a semiconductor design technology, and more particularly, to a semiconductor device using a clock.

2. Description of the Related Art

In general, a semiconductor device operates at a predetermined operation speed in a semiconductor system. This requires the use of a clock which pulses at a predetermined interval which is provided by a control device in the semiconductor system.

A semiconductor device such as a Dynamic Random Access Memory (DRAM) device performs a refresh operation in synchronization with a clock. This specification uses a semiconductor device capable of performing a refresh operation as an example of the related art and also as an embodiment of the present invention.

Figure 1:
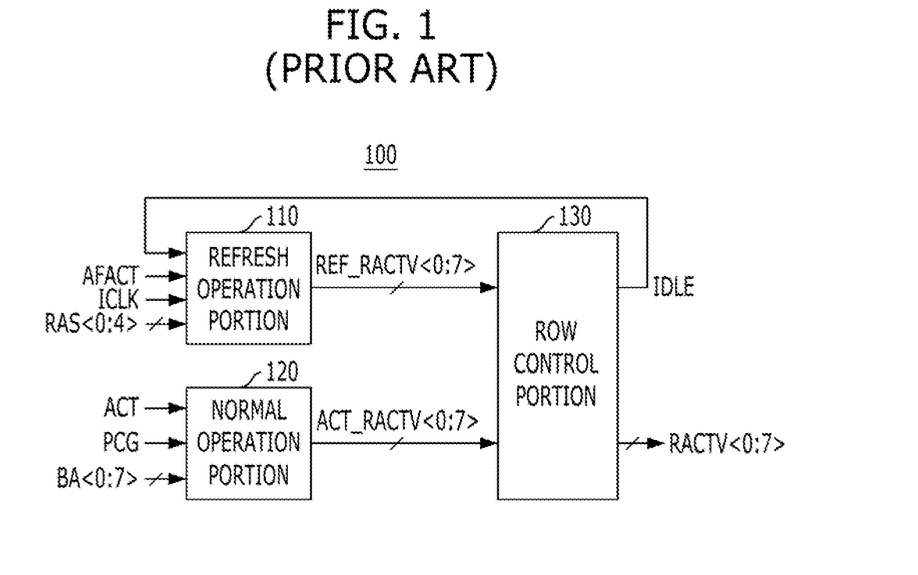
FIG. 1 is a block diagram illustrating a semiconductor device according to prior art.

FIG. 1 is a block diagram illustrating a semiconductor device 100 according to a prior art.

Referring to FIG. 1, the semiconductor device 100 includes a refresh operation portion 110, a normal operation portion 120, and a row control portion 130. The refresh operation portion 110 sequentially generates first to eighth refresh operation control signals REF_RACTV<0:7> during a predetermined refresh period in response to an idle signal IDLE, a refresh source signal AFACT, a clock ICLK and counting codes RAS<0:4>. The normal operation portion 120 sequentially generates first to eighth normal operation control signals ACT_RACTV<0:7> during a predetermined normal period in response to an active signal ACT, a pre-charge signal PCG, and first to eighth bank addresses BA<0:7>. The row control portion 130 generates the idle signal IDLE and first to eighth row active signals RACTV<0:7> in response to the first to eighth refresh operation control signals REF_RACTV<0:7> and the first to eighth normal operation control signals ACT_RACTV<0:7>.

Figure 2:
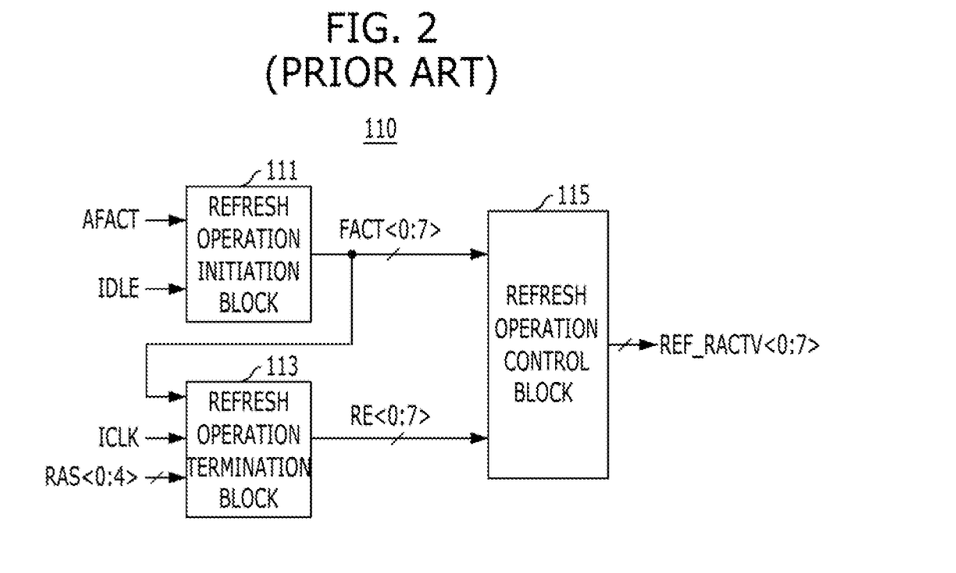
FIG. 2 is a block diagram illustrating a refresh operation portion shown in FIG. 1.

FIG. 2 is a block diagram illustrating the refresh operation portion 110 shown in FIG. 1.

Referring to FIG. 2, the refresh operation portion 110 includes a refresh operation initiation block 111, a refresh operation termination block 113, and a refresh operation control block 115. The refresh operation initiation block 111 sequentially generates first to eighth refresh operation initiation signals FACT<0:7> during a refresh period in response to the refresh source signal AFACT and the idle signal IDLE. The refresh operation termination block 113 sequentially generates first to eighth refresh operation termination signals RE<0:7> in response to the first to eighth refresh operation initiation signals FACT<0:7>, the clock ICLK, and the counting codes RAS<0:4>. The refresh operation control block 115 generates first to eighth refresh operation control signals REF_RACTV<0:7> in response to the first to eighth refresh operation initiation signals FACT<0:7> and the first to eighth refresh operation termination signals RE<0:7>.

Figure 3:
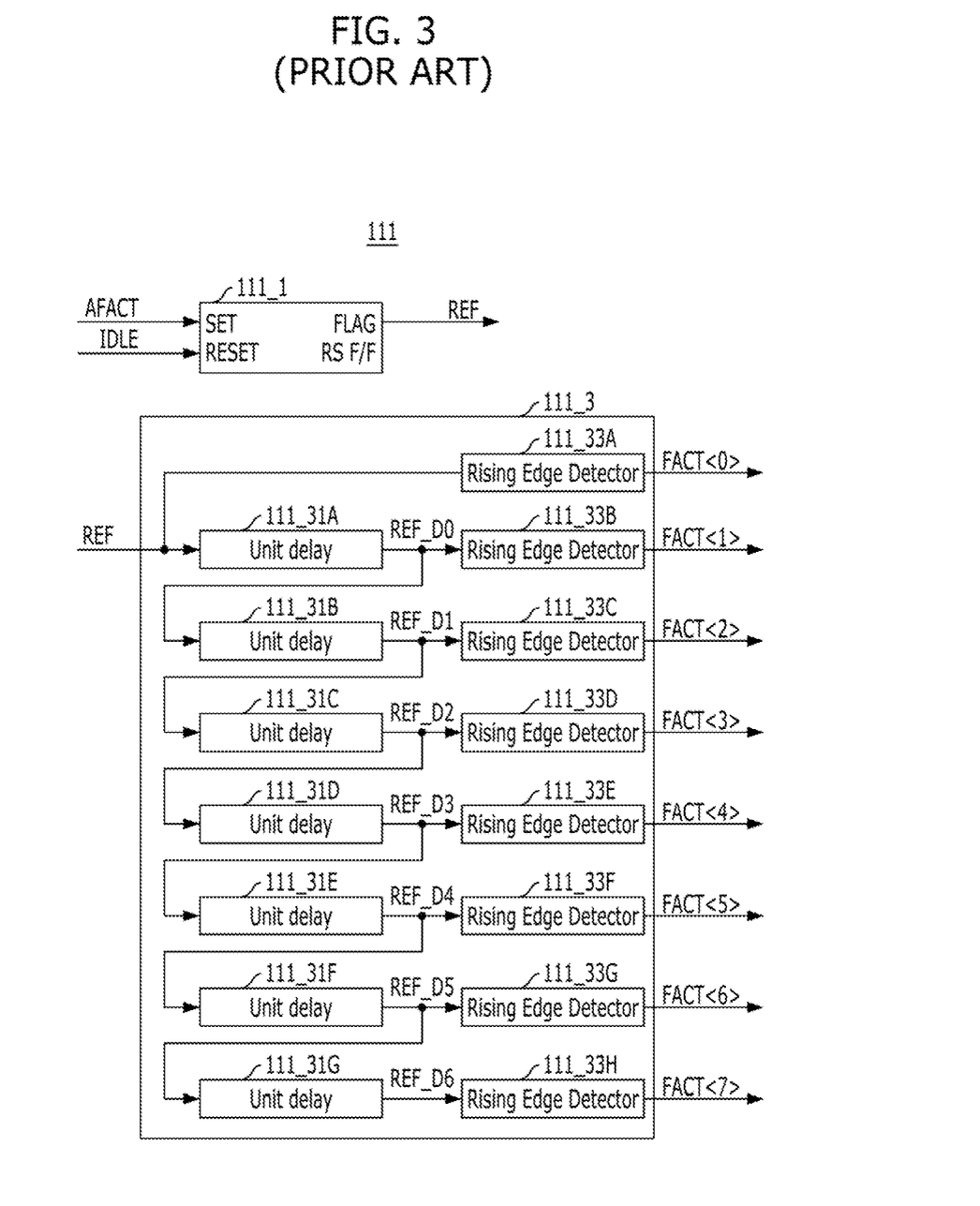
FIG. 3 is a block diagram illustrating a refresh operation initiation block shown in FIG. 2.

FIG. 3 is a block diagram illustrating the refresh operation initiation block 111 shown in FIG. 2.

Referring to FIG. 3, the refresh operation initiation block 111 includes a refresh operation initiation control unit 111_1 and a refresh operation initiation signal generation unit 111_3. The refresh operation initiation control unit 111_1 generates a refresh operation initiation control signal REF, which is enabled during the refresh period in response to the refresh source signal AFACT and the idle signal IDLE. The refresh operation initiation signal generation unit 111_3 generates the first to eighth refresh operation initiation signals FACT<0:7> by sequentially delaying the refresh operation initiation control signal REF. The refresh operation initiation control unit 111_1 enables the refresh operation initiation control signal REF in response to the refresh source signal AFACT and disables the refresh operation initiation control signal REF in response to the idle signal IDLE. For example, the refresh operation initiation control unit 111_1 is an RS latch. The refresh operation initiation signal generation unit 111_3 includes first to seventh unit delayers 111_31A to 111_31G and first to eighth pulse generators 111_33A to 111_33H. The first to seventh unit delayers 111_31A to 111_31G, which are coupled in cascade structure, respectively generate the first to seventh delay signals REF_D0 to REF_D6 by sequentially delaying the refresh operation initiation control signal REF and the delay signal of the previous stage with a predetermined amount of delay. The first to eighth pulse generators 111_33A to 111_33H generate the first to eighth refresh operation initiation signals FACT<0:7> respectively corresponding to the refresh operation initiation control signal REF and the first to seventh delay signals REF_D0 to REF_D6. For example, each of the first to eighth pulse generators 111_33A to 111_33H is a rising edge detector generating a pulse by detecting a rising edge of an input signal.

Referring back to FIG. 2, the refresh operation termination block 113 counts the clock ICLK in response to each enablement of the first to eighth refresh operation initiation signals FACT<0:7>. When each count of the refresh operation termination block 113 reaches a predetermined count number corresponding to the counting codes RAS<0:4>, for example 2 cycles of the clock ICLK, the refresh operation termination block 113 enables each of the first to eighth refresh operation termination signals RE<0:7> in synchronization with the clock ICLK. For example, the refresh operation termination block 113 is a counter.

The refresh operation control block 115 enables the first to eighth refresh operation control signals REF_RACTV<0:7> in response to the first to eighth refresh operation initiation signals FACT<0:7> and disables the first to eighth refresh operation control signals REF_RACTV<0:7> in response to the first to eighth refresh operation termination signals RE<0:7>. For example, the refresh operation control block 115 includes first to eighth RS latches.

Figure 4:
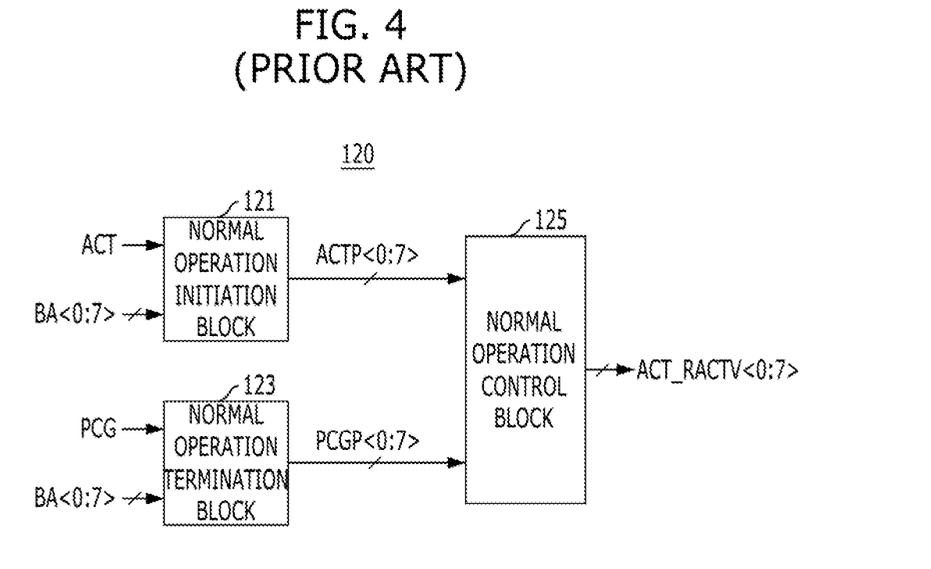
FIG. 4 is a block diagram illustrating a normal operation portion shown in FIG. 1.

FIG. 4 is a block diagram illustrating the normal operation portion 120 shown in FIG. 1.

Referring to FIG. 4, the normal operation portion 120 includes a normal operation initiation block 121, a normal operation termination block 123 and a normal operation control block 125. The normal operation initiation block 121 generates first to eighth normal operation initiation signals ACTP<0:7> in response to the active signal ACT and the first to eighth bank addresses BA<0:7>. The normal operation termination block 123 generates first to eighth normal operation termination signals PCGP<0:7> in response to the pre-charge signal PCG and the first to eighth bank addresses BA<0:7>. The normal operation control block 125 generates the first to eighth normal operation control signals ACT_RACTV<0:7> in response to the first to eighth normal operation initiation signals ACTP<0:7> and the first to eighth normal operation termination signals PCGP<0:7>.

The normal operation initiation block 121 enables one or more of the first to eighth normal operation initiation signals ACTP<0:7> by performing a logic operation on the active signal ACT and the first to eighth bank addresses BA<0:7>.

The normal operation termination block 123 enables one or more of the first to eighth normal operation termination signals PCGP<0:7> by performing the logic operation on the pre-charge signal PCG and the first to eighth bank addresses BA<0:7>.

The normal operation control block 125 enables the first to eighth normal operation control signals ACT_RACTV<0:7> in response to the first to eighth normal operation initiation signals ACTP<0:7> and disables the first to eighth normal operation control signals ACT_RACTV<0:7> in response to the first to eighth normal operation termination signals PCGP<0:7>.

Figure 5:
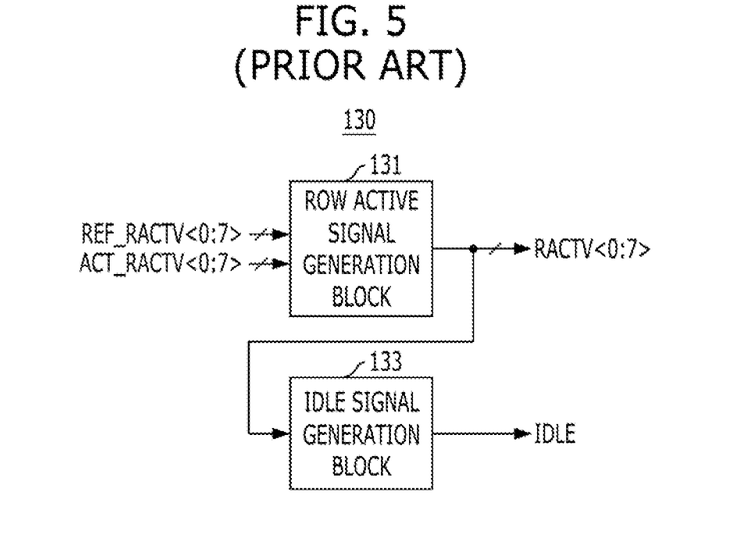
FIG. 5 is a block diagram illustrating a row control portion shown in FIG. 1.

FIG. 5 is a block diagram illustrating the row control portion 130 shown in FIG. 1.

Referring to FIG. 5, the row control portion 130 includes a row active signal generation block 131 and an idle signal generation block 133. The row active signal generation block 131 enables the first to eighth row active signals RACTV<0:7> when the first to eighth refresh operation control signals REF_RACTV<0:7> are enabled, or when the first to eighth normal operation control signals ACT_RACTV<0:7> are enabled. The idle signal generation block 133 enables the idle signal IDLE when the first to eighth row active signals RACTV<0:7> are disabled.

Figure 6:
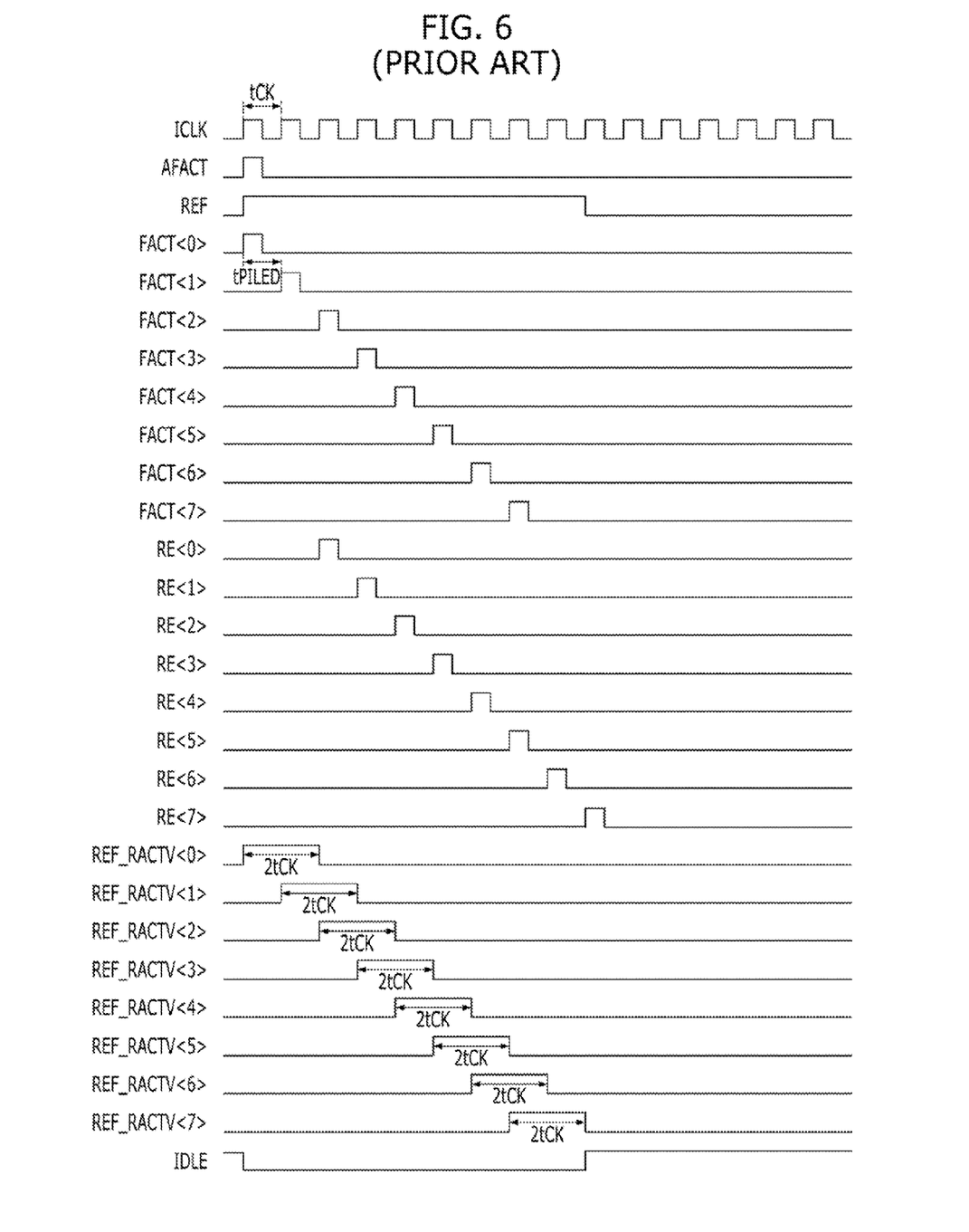
FIG. 6 is a timing diagram illustrating a refresh operation of the semiconductor device shown in FIG. 1.

An operation of the semiconductor device 100 is described hereafter with reference to FIG. 6.

FIG. 6 is a timing diagram illustrating a refresh operation of the semiconductor device 100 shown in FIG. 1. FIG. 6 shows the refresh operation as an example of the operation of the semiconductor device 100.

Referring to FIG. 6, the refresh operation initiation block 111 sequentially enables the first to eighth refresh operation initiation signals FACT<0:7> during a refresh operation section in response to the refresh source signal AFACT. The refresh operation initiation block 111 enables each of the first to eighth refresh operation initiation signals FACT<0:7> at an interval of a predetermined amount of delay tPILED.

The refresh operation termination block 113 enables each of the first to eighth refresh operation termination signals RE<0:7> in response to each count of the clock ICLK reaching the predetermined count number corresponding to the counting codes RAS<0:4>, for example 2 cycles of the clock ICLK. As described above, the refresh operation termination block 113 counts the clock ICLK in response to each enablement of the first to eighth refresh operation initiation signals FACT<0:7> until each count of the refresh operation termination block 113 reaches the predetermined count number corresponding to the counting codes RAS<0:4>, for example 2 cycles of the clock ICLK. When each count of the refresh operation termination block 113 reaches the predetermined count number corresponding to the counting codes RAS<0:4>, for example 2 cycles of the clock ICLK, the refresh operation termination block 113 enables each of the first to eighth refresh operation termination signals RE<0:7> in synchronization with the clock ICLK.

The refresh operation control block 115 sequentially generates the first to eighth refresh operation control signals REF_RACTV<0:7> during the refresh period in response to the first to eighth refresh operation initiation signals FACT<0:7> and the first to eighth refresh operation termination signals RE<0:7>. In other words, the refresh operation control block 115 enables the first to eighth refresh operation control signals REF_RACTV<0:7> in response to the first to eighth refresh operation initiation signals FACT<0:7> and disables the first to eighth refresh operation control signals REF_RACTV<0:7> in response to the first to eighth refresh operation termination signals RE<0:7>.

The semiconductor device 100 having such structure described above performs the refresh operation by using the signals in synchronization with the clock, and thus it is easy to control the semiconductor device 100.

However, the following problem exists in the semiconductor device 100 having the structure described above.

FIG. 6 illustrates a case where the predetermined amount of delay tPILED between the first to eighth refresh operation initiation signals FACT<0:7> is longer than a time tCK corresponding to a period of the clock ICLK (tPILED>tCK). Therefore, the refresh operation of the semiconductor device 100 works when the first to eighth refresh operation termination signals RE<0:7> are generated in synchronization with the clock ICLK. However, when the predetermined amount of delay tPILED between the first to eighth refresh operation initiation signals FACT<0:7> is shorter than the time tCK corresponding to the period of the clock ICLK (tPILED<tCK), the following problem may arise. This problem is described below with reference to the drawing FIG. 7.

Figure 7:
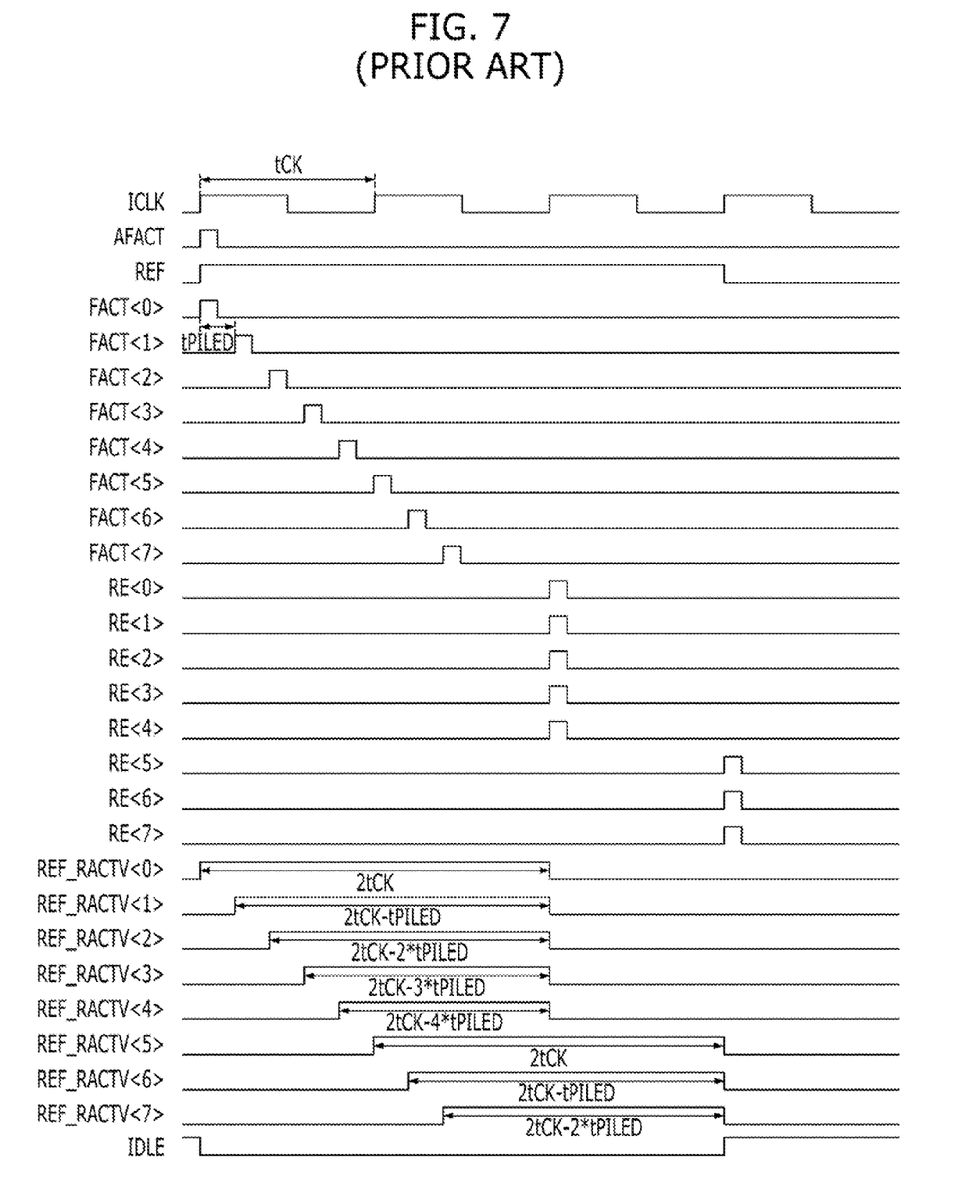
FIG. 7 a timing diagram illustrating a refresh operation of the semiconductor device shown in FIG. 1.

FIG. 7 a timing diagram illustrating a refresh operation of the semiconductor device 100 shown in FIG. 1.

Referring to FIG. 7, while the first to eighth refresh operation initiation signals FACT<0:7> are delayed with the predetermined amount of delay tPILED and sequentially generated, the first to eighth refresh operation termination signals RE<0:7> are not sequentially and simultaneously generated at the same time, unlike the first to eighth refresh operation initiation signals FACT<0:7>. This is because the first to eighth refresh operation termination signals RE<0:7> are generated in synchronization with the clock ICLK. Accordingly, the semiconductor device 100 has a problem with power noise caused by the disablement of the first to eighth refresh operation control signals REF_RACTV<0:7> occurring at the same time.

SUMMARY

Exemplary embodiments of the present invention are directed to a semiconductor device that may prevent disablement of a plurality of signals from occurring at the same time regardless of the clock frequency with which the plurality of signals are synchronized.

In accordance with an embodiment of the present invention, a semiconductor device may include an operation initiation block suitable for sequentially generating a plurality of operation initiation signals at an interval of a predetermined time in response to an operation initiation source signal, a clock-based signal generation block suitable for generating an operation termination source signal in response to one of the multiple operation initiation signals and a clock, an operation termination block suitable for sequentially generating a plurality of operation termination signals at the predetermined time interval in response to the operation termination source signal, and an operation control block suitable for sequentially generating a plurality of first operation control signals in response to the multiple operation initiation signals and the multiple operation termination signals.

The predetermined time interval may be shorter than the period of the clock.

In accordance with another embodiment of the present invention, a semiconductor device may include an operation initiation control unit suitable for generating a first refresh flag signal in response to a refresh initiation source signal and an idle signal; a plurality of first unit delay units suitable for generating a plurality of first delay signals by sequentially delaying the first refresh flag signal at a predetermined time interval; a first pulse generation unit suitable for sequentially generating a plurality of refresh initiation signals in response to the first refresh flag signal and the multiple first delay signals; a clock-based signal generation unit suitable for generating a refresh termination source signal in response to a clock, counting codes and a first refresh initiation signal among the multiple refresh initiation signals; an operation termination control unit suitable for generating a second refresh flag signal in response to the refresh termination source signal and the idle signal; a plurality of second unit delay units suitable for generating a plurality of second delay signals by sequentially delaying the second refresh flag signal at the predetermined time interval; a second pulse generation unit suitable for sequentially generating a plurality of refresh termination signals in response to the second refresh flag signal and the multiple second delay signals; and an operation control unit suitable for sequentially generating a plurality of refresh control signals in response to the multiple refresh initiation signals and the multiple refresh termination signals.

The predetermined time interval may be shorter than the period of the clock.

DETAILED DESCRIPTION

Exemplary embodiments of the present invention will be described below in more detail with reference to the accompanying drawings. These embodiments are provided so that this disclosure will be thorough and complete, and will fully convey the scope of the present invention to those skilled in the art.

A semiconductor device capable of performing a refresh operation will be described as an example of an embodiment of the present invention.

Figure 8:
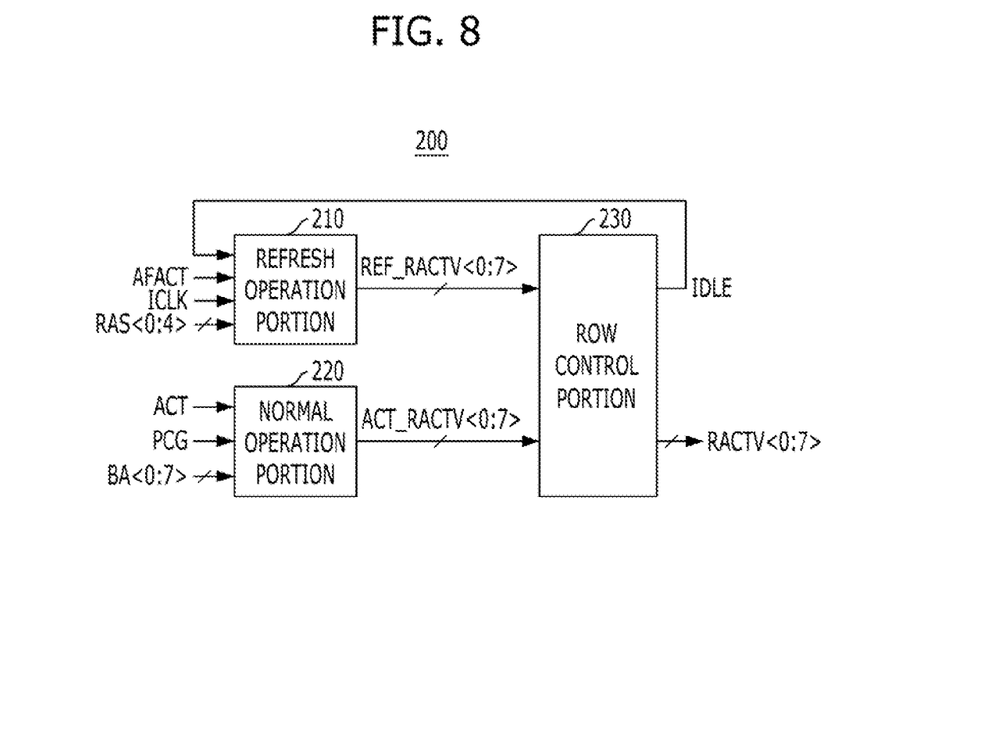
FIG. 8 is a block diagram illustrating a semiconductor device in accordance with an embodiment of the present invention.

FIG. 8 is a block diagram illustrating a semiconductor device 200 in accordance with an embodiment of the present invention.

Referring to FIG. 8, the semiconductor device 200 may include a refresh operation portion 210, a normal operation portion 220 and a row control portion 230. The refresh operation portion 210 may sequentially generate first to eighth refresh operation control signals REF_RACTV<0:7> during a predetermined refresh period in response to an idle signal IDLE, a refresh source signal AFACT, a clock ICLK and counting codes RAS<0:4>. The normal operation portion 220 may sequentially generate first to eighth normal operation control signals ACT_RACTV<0:7> during a predetermined normal period in response to an active signal ACT, a precharge signal PCG and first to eighth bank addresses BA<0:7>. The row control portion 230 may generate the idle signal IDLE and first to eighth row active signals RACTV<0:7> in response to the first to eighth refresh operation control signals REF_RACTV<0:7> and the first to eighth normal operation control signals ACT_RACTV<0:7>.

The refresh period is the time period required to refresh a plurality of memory regions (not shown). For example, the multiple memory regions may include first to eighth banks, and each of the first to eighth row active signals RACTV<0:7> are for refreshing each of the first to eighth banks.

Figure 9:
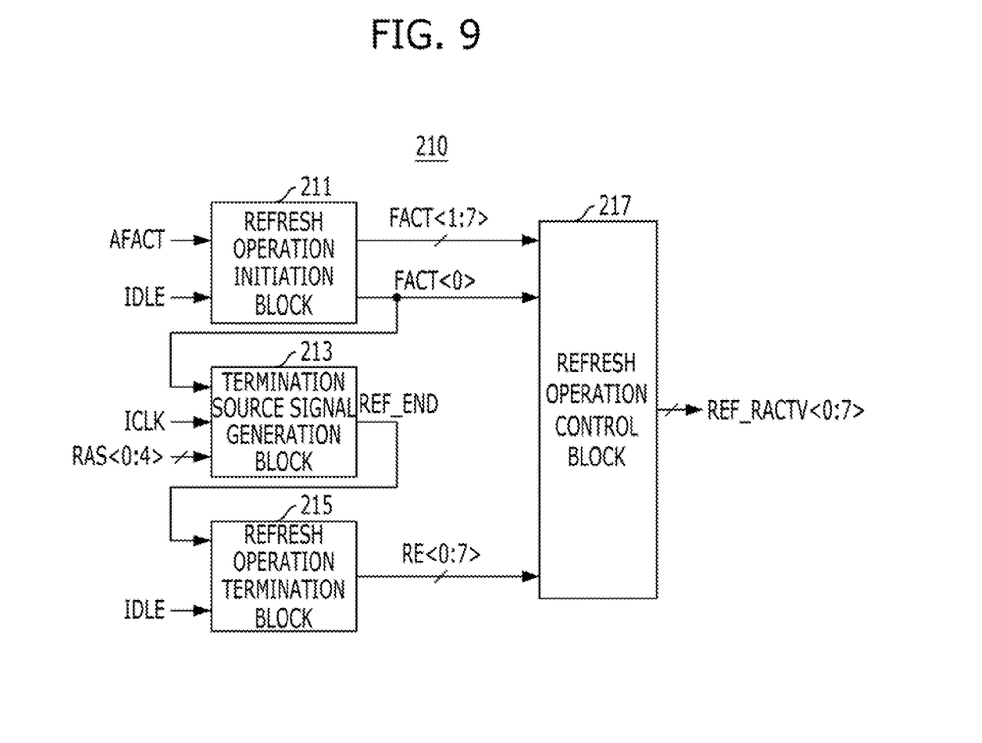
FIG. 9 is a block diagram illustrating a refresh operation portion shown in FIG. 8.

FIG. 9 is a block diagram illustrating the refresh operation portion 210 shown in FIG. 8.

Referring to FIG. 9, the refresh operation portion 210 may include a refresh operation initiation block 211, a termination source signal generation block 213, a refresh operation termination block 215, and a refresh operation control block 217. The refresh operation initiation block 211 may sequentially generate first to eighth refresh operation initiation signals FACT<0:7> during a refresh period in response to the refresh source signal AFACT and the idle signal IDLE. The termination source signal generation block 213 may generate a termination source signal REF_END in response to a first refresh operation initiation signal FACT<0>, which is enabled first among the first to eighth refresh operation initiation signals FACT<0:7>, the clock ICLK, and the counting codes RAS<0:4>. The refresh operation termination block 215 may sequentially generate first to eighth refresh operation termination signals RE<0:7> during the refresh period in response to the termination source signal REF_END and the idle signal IDLE. The refresh operation control block 217 may generate first to eighth refresh operation control signals REF_RACTV<0:7> in response to the first to eighth refresh operation initiation signals FACT<0:7> and the first to eighth refresh operation termination signals RE<0:7>.

Figure 10:
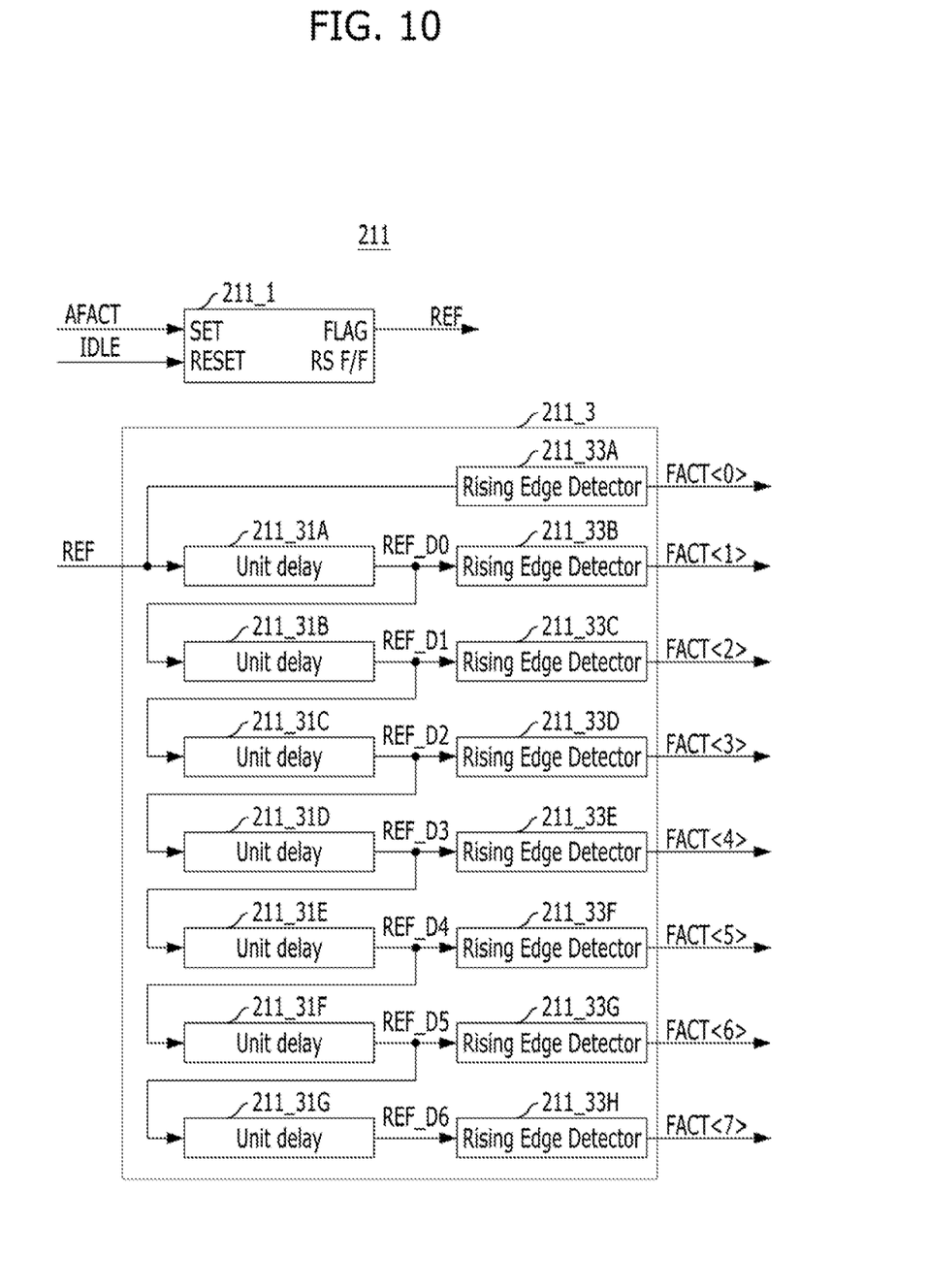
FIG. 10 is a block diagram illustrating a refresh operation initiation block shown in FIG. 9.

FIG. 10 is a block diagram illustrating the refresh operation initiation block 211 shown in FIG. 9.

Referring to FIG. 10, the refresh operation initiation block 211 may include a refresh operation initiation control unit 211_1 and a refresh operation initiation signal generation unit 211_3. The refresh operation initiation control unit 211_1 may generate a refresh operation initiation control signal REF, which is enabled during the refresh period in response to the refresh source signal AFACT and the idle signal IDLE. The refresh operation initiation signal generation unit 211_3 may generate the first to eighth refresh operation initiation signals FACT<0:7> by sequentially delaying the refresh operation initiation control signal REF. The refresh operation initiation control unit 211_1 may enable the refresh operation initiation control signal REF in response to the refresh source signal AFACT and disable the refresh operation initiation control signal REF in response to the idle signal IDLE. For example, the refresh operation initiation control unit 211_1 may be an RS latch. The refresh operation initiation signal generation unit 211_3 may include first to seventh unit delayers 211_31A to 211_31G and first to eighth pulse generators 211_33A to 211_33H. The first to seventh unit delayers 211_31A to 211_31G, which are coupled in cascade structure, may respectively generate the first to seventh delay signals REF_D0 to REF_D6 by sequentially delaying the refresh operation initiation control signal REF and the delay signal of the previous stage with a predetermined amount of delay tPILED. The first to eighth pulse generators 211_33A to 211_33H may generate the first to eighth refresh operation initiation signals FACT<0:7> respectively corresponding to the refresh operation initiation control signal REF and the first to seventh delay signals REF_D0 to REF_D6. For example, each of the first to eighth pulse generators 211_33A to 211_33H may be a rising edge detector generating a pulse by detecting a rising edge of an input signal thereof.

Referring back to FIG. 9, the termination source signal generation block 213 may count the clock ICLK in response to each enablement of the first refresh operation initiation signal FACT<O>, and may enable the termination source signal REF_END when each count of the termination source signal generation block 213 reaches a predetermined count number corresponding to the counting codes RAS<0:4>, for example 2 cycles of the clock ICLK. For example, the termination source signal generation block 213 may be a counter.

Figure 11:
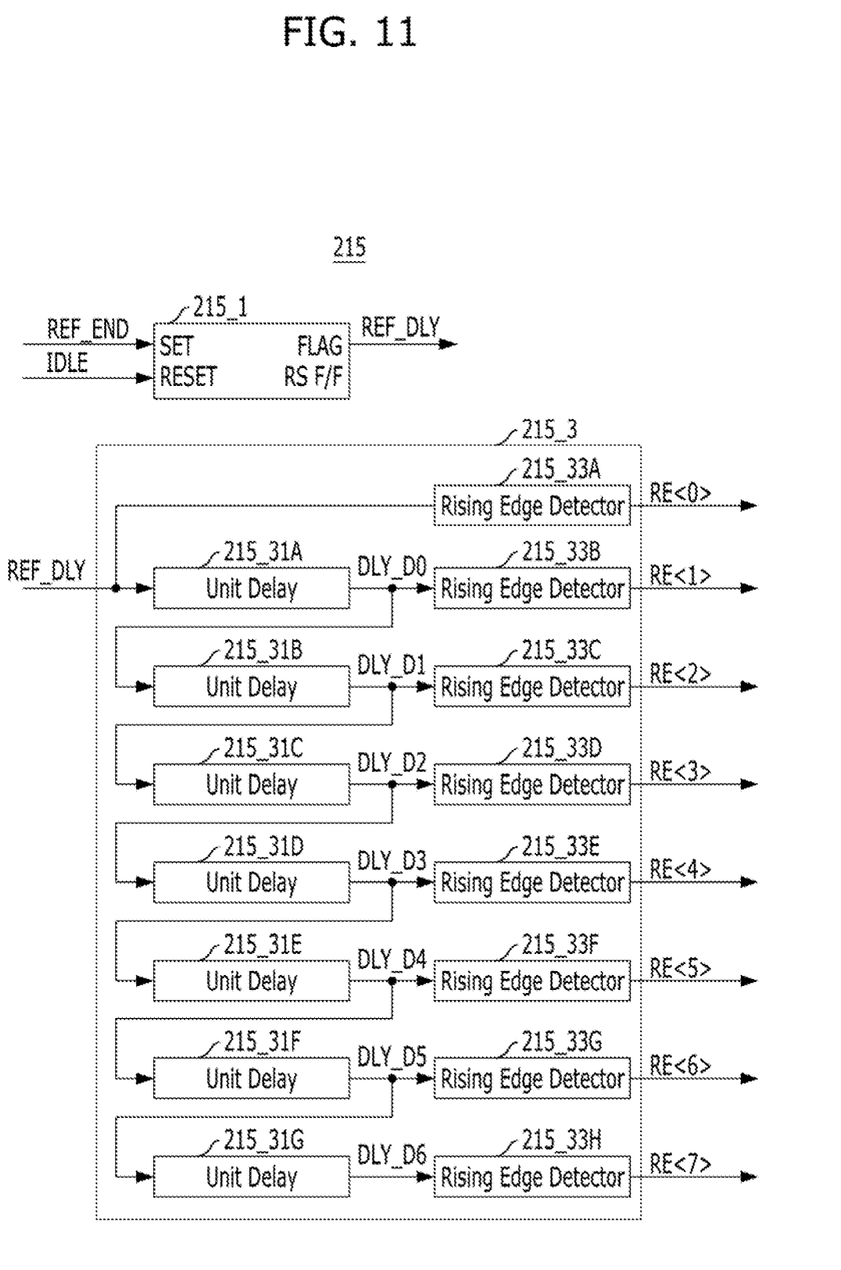
FIG. 11 is a block diagram illustrating a refresh operation termination block shown in FIG. 9.

FIG. 11 is a block diagram illustrating a refresh operation termination block 215 shown in FIG. 9.

Referring to FIG. 11, the refresh operation termination block 215 may include a refresh operation termination control unit 215_1 and a refresh operation termination signal generation unit 215_3. The refresh operation termination control unit 215_1 may generate a refresh operation termination control signal REF_DLY, which is enabled during the refresh period in response to the termination source signal REF_END and the idle signal IDLE. The refresh operation termination signal generation unit 215_3 may generate the first to eighth refresh operation termination signals RE<0:7> by sequentially delaying the refresh operation termination control signal REF_DLY. The refresh operation termination control unit 215_1 may enable the refresh operation termination control signal REF_DLY in response to the termination source signal REF_END and disable the refresh operation termination control signal REF_DLY in response to the idle signal IDLE. For example, the refresh operation termination control unit 215_1 may be an RS latch. The refresh operation termination signal generation unit 215_3 may include eighth to fourteenth unit delayers 215_31A to 215_31G and ninth to sixteenth pulse generators 215_33A to 215_33H. The eighth to fourteenth unit delayers 215_31A to 215_31G, which are coupled in cascade structure, may respectively generate the eighth to fourteenth delay signals DLY_D0 to DLY_D6 by sequentially delaying the refresh operation termination control signal REF_DLY and the delay signal of the previous stage with the predetermined amount of delay tPILED. The ninth to sixteenth pulse generators 215_33A to 215_33H may generate the first to eighth refresh operation termination signals RE<0:7> respectively corresponding to the refresh operation termination control signal REF_DLY and the eighth to fourteenth delay signals DLY_D0 to DLY_D6. For example, each of the ninth to sixteenth pulse generators 215_33A to 215_33H may be a rising edge detector generating a pulse by detecting a rising edge of an input signal.

Figure 12:
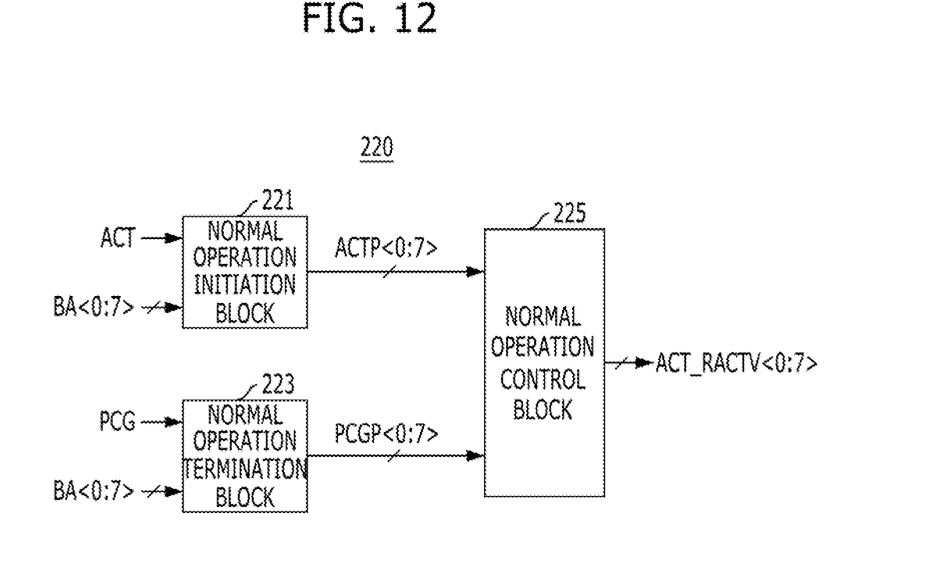
FIG. 12 is a block diagram illustrating a normal operation portion shown in FIG. 8.

FIG. 12 is a block diagram illustrating the normal operation portion 220 shown in FIG. 8.

Referring to FIG. 12, the normal operation portion 220 may include a normal operation initiation block 221, a normal operation termination block 223 and a normal operation control block 225. The normal operation initiation block 221 may generate first to eighth normal operation initiation signals ACTP<0:7> in response to the active signal ACT and the first to eighth bank addresses BA<0:7>. The normal operation termination block 223 may generate first to eighth normal operation termination signals PCGP<0:7> in response to the pre-charge signal PCG and the first to eighth bank addresses BA<0:7>. The normal operation control block 225 may generate the first to eighth normal operation control signals ACT_RACTV<0:7> in response to the first to eighth normal operation initiation signals ACTP<0:7> and the first to eighth normal operation termination signals PCGP<0:7>.

The normal operation initiation block 221 may enable one or more of the first to eighth normal operation initiation signals ACTP<0:7> by performing a logic operation on the active signal ACT and the first to eighth bank addresses BA<0:7>.

The normal operation termination block 223 may enable one or more of the first to eighth normal operation termination signals PCGP<0:7> by performing the logic operation on the pre-charge signal PCG and the first to eighth bank addresses BA<0:7>.

The normal operation control block 225 may enable the first to eighth normal operation control signals ACT_RACTV<0:7> in response to the first to eighth normal operation initiation signals ACTP<0:7> and disable the first to eighth normal operation control signals ACT_RACTV<0:7> in response to the first to eighth normal operation termination signals PCGP<0:7>.

Figure 13:
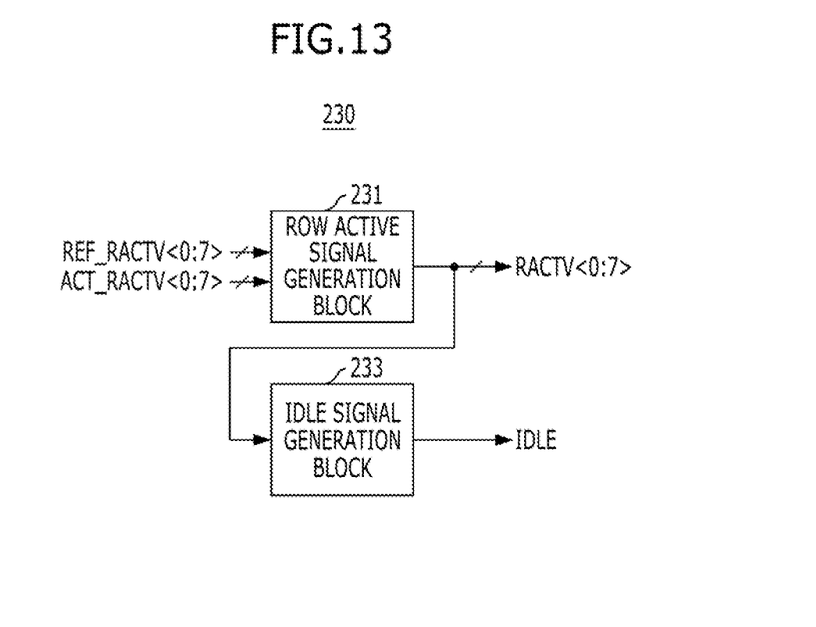
FIG. 13 is a block diagram illustrating a row control portion shown in FIG. 8.

FIG. 13 is a block diagram illustrating the row control portion 230 shown in FIG. 8.

Referring to FIG. 13, the row control portion 230 may include a row active signal generation block 231 and an idle signal generation block 233. The row active signal generation block 231 may enable the first to eighth row active signals RACTV<0:7> when the first to eighth refresh operation control signals REF_RACTV<0:7> are enabled, or when the first to eighth normal operation control signals ACT_RACTV<0:7> are enabled. The idle signal generation block 233 may enable the idle signal IDLE when the first to eighth row active signals RACTV<0:7> are disabled.

Figure 14:
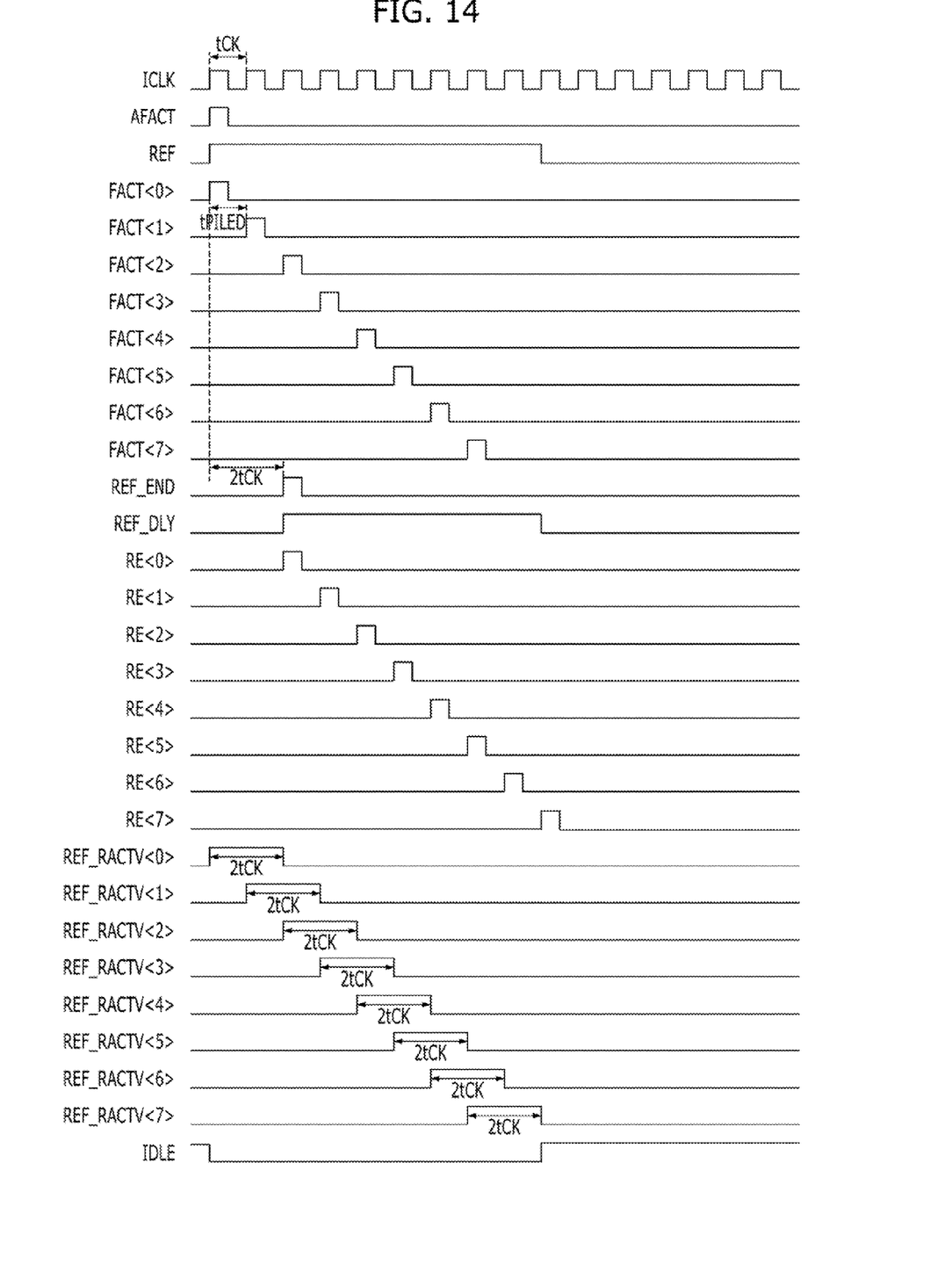
FIGS. 14 and 15 are timing diagrams Illustrating an operation of the semiconductor device shown in FIG. 8.
Figure 15:
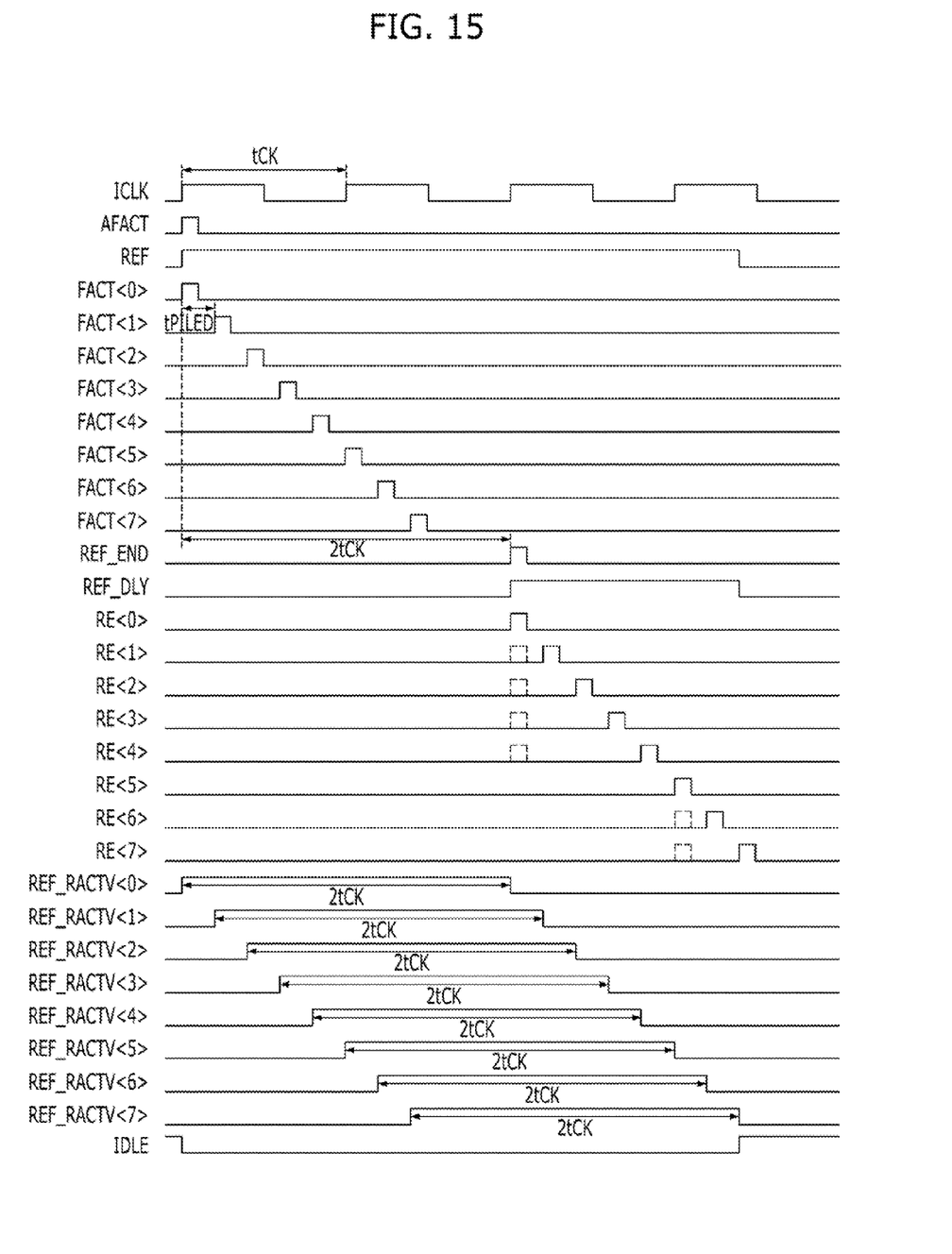

An operation of the semiconductor device 200 is described hereafter with reference to the accompanying drawings FIGS. 14 and 15.

FIG. 14 is a timing diagram illustrating a refresh operation of the semiconductor device 200. FIG. 14 shows the refresh operation as an example of the operation of the semiconductor device 200. As shown in FIG. 14, the predetermined amount of delay tPILED of each of the first to eighth refresh operation initiation signals FACT<0:7> is longer than a time tCK corresponding to a period of the clock ICLK (tPILED>tCK).

Referring to FIG. 14, the refresh operation initiation block 211 may sequentially enable the first to eighth refresh operation initiation signals FACT<0:7> during a refresh operation section in response to the refresh source signal AFACT and the idle signal IDLE. To be specific, the refresh operation initiation control unit 211_1 may enable the refresh operation initiation control signal REF in response to the refresh source signal AFACT and disable the refresh operation initiation control signal REF in response to the idle signal IDLE. The first to seventh unit delayers 211_31A to 211_31G may generate the first to seventh delay signals REF_D0 to REF_D6 by sequentially delaying the refresh operation initiation control signal REF by the predetermined delay time tPILED. The first to eighth pulse generators 211_33A to 211_33H may generate the first to eighth refresh operation initiation signals FACT<0:7> respectively corresponding to the refresh operation initiation control signal REF and the first to seventh delay signals REF_D0 to REF_D6, based on a rising edge of each of the signals REF and REF_D0 to REF_D6. The first to eighth refresh operation initiation signals FACT<0:7> may sequentially pulse at an interval of the predetermined amount of delay tPILED.

The termination source signal generation block 213 may generate the termination source signal REF_END in response to the first refresh operation initiation signal FACT<O>, which is enabled first among the first to eighth refresh operation initiation signals FACT<0:7>, and the count of the clock ICLK reaching the predetermined count number corresponding to the counting codes RAS<0:4>, for example 2 cycles of the clock ICLK. Herein, the termination source signal generation block 213 may count the clock ICLK in response to enablement of the first refresh operation initiation signal FACT<0> until the count of the termination source signal generation block 213 reaches the predetermined count number corresponding to the counting codes RAS<0:4>, for example 2 cycles of the clock ICLK. When the count of the termination source signal generation block 213 reaches the predetermined count number corresponding to the counting codes RAS<0:4>, for example 2 cycles of the clock ICLK, the termination source signal generation block 213 may enable the termination source signal REF_END in synchronization with the clock ICLK. For example, the termination source signal generation block 213 may enable the termination source signal REF_END after two periods 2tCK of the clock ICLK passes from an enabling moment of the first refresh operation initiation signal FACT<O>.

The refresh operation termination block 215 may sequentially enable the first to eighth refresh operation termination signals RE<0:7> during the refresh operation section in response to the termination source signal REF_END and the idle signal IDLE. To be specific, the refresh operation termination control unit 215_1 may enable the refresh operation termination control signal REF_DLY in response to the termination source signal REF_END and disable the refresh operation termination control signal REF_DLY in response to the idle signal IDLE. The eighth to fourteenth unit delayers 215_31A to 215_31G may generate the eighth to fourteenth delay signals DLY_D0 to DLY_D6 by sequentially delaying the refresh operation termination control signal REF_DLY by the predetermined amount of delay tPILED. The ninth to sixteenth pulse generators 215_33A to 215_33H may generate the first to eighth refresh operation termination signals RE<0:7> corresponding to the refresh operation termination control signal REF_DLY and the eighth to 14th delay signals DLY_D0 to DLY_D6, based on the rising edge of each of the signals REF_DLY and DLY_D0 to DLY_D6. The first to eighth refresh operation termination signals RE<0:7> sequentially pulse at the interval of the predetermined amount of delay tPILED.

The refresh operation control block 217 may sequentially generate the first to eighth refresh operation control signals REF_RACTV<0:7> during the refresh period in response to the first to eighth refresh operation initiation signals FACT<0:7> and the first to eighth refresh operation termination signals RE<0:7>. In other words, the refresh operation control block 217 may enable the first to eighth refresh operation control signals REF_RACTV<0:7> in response to the first to eighth refresh operation initiation signals FACT<0:7> and disable the first to eighth refresh operation control signals REF_RACTV<0:7> in response to the first to eighth refresh operation termination signals RE<0:7>.

FIG. 15 is a timing diagram illustrating a refresh operation of the semiconductor device 200. FIG. 15 also shows the refresh operation as an example of the operation of the semiconductor device 200. As shown in FIG. 15, the predetermined amount of delay tPILED of each of the first to eighth refresh operation initiation signals FACT<0:7> is shorter than the time tCK corresponding to a first period of the clock ICLK (tPILED<tCK).

Referring to FIG. 15, the first to eighth refresh operation termination signals RE<0:7> may be sequentially generated at the interval of the predetermined amount of delay tPILED based on the termination source signal REF_END, similarly as shown in FIG. 14. In other words, since the first refresh operation termination signal RE<0> may be generated in response to the termination source signal REF_END synchronized with the clock ICLK, and the second and eighth refresh operation termination signals RE<1:7> desynchronized with the clock ICLK may be generated by sequentially delaying the first refresh operation termination signal RE<0> by the predetermined amount of delay tPILED, the first to eighth refresh operation termination signals RE<0:7> may be sequentially generated regardless of the clock ICLK.

In conclusion, the enabling periods of the first to eighth refresh operation control signals REF_RACTV<0:7> may be defined corresponding to the period, e.g., 2tCK, of the clock ICLK, and the disabling periods of the first to eighth refresh operation control signals REF_RACTV<0:7> are dispersed.

Since the operation processes other than the aforementioned operation process shown in FIG. 15 are the same as that shown in FIG. 14, a description thereon is omitted.

In accordance with the embodiments of the present invention, since the first to eighth refresh operation termination signals RE<0:7> may be sequentially disabled regardless of the frequency of the clock ICLK, power noise may be reduced.

While the present invention has been described with respect to specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A semiconductor device, comprising:
an operation initiation block suitable for sequentially generating a plurality of operation initiation signals at a predetermined time interval in response to an operation initiation source signal;
a clock-based signal generation block suitable for generating an operation termination source signal in response to a clock and one of the multiple operation initiation signals;
an operation termination block suitable for sequentially generating a plurality of operation termination signals at the predetermined time interval in response to the operation termination source signal; and
an operation control block suitable for sequentially generating a plurality of first operation control signals in response to the multiple operation initiation signals and the multiple operation termination signals.

2. The semiconductor device of claim 1, wherein the predetermined time interval is shorter than a period of the clock.

3. The semiconductor device of claim 1, wherein the operation initiation block sequentially generates the multiple operation initiation signals during a predetermined operation section.

4. The semiconductor device of claim 3, wherein the operation termination block sequentially generates the multiple operation termination signals during the predetermined operation section.

5. The semiconductor device of claim 4, wherein the predetermined operation section includes a refresh operation section for refreshing a plurality of memory regions.

6. The semiconductor device of claim 5, wherein the multiple first operation control signals include a plurality of refresh signals for sequentially refreshing the multiple memory regions.

7. The semiconductor device of claim 1, wherein the operation initiation block and the operation termination block are designed to have the same internal structure.

8. The semiconductor device of claim 7, wherein the operation initiation block includes:
an operation initiation control unit suitable for generating an operation initiation control signal in response to the operation initiation source signal and an idle signal; and
an operation initiation signal generation unit suitable for generating the multiple operation initiation signals by sequentially delaying the operation initiation control signal.

9. The semiconductor device of claim 8, wherein the operation termination block includes:
an operation termination control unit suitable for generating an operation termination control signal in response to the operation termination source signal and the idle signal; and
an operation termination signal generation unit suitable for generating the multiple operation termination signals by sequentially delaying the operation termination control signal.

10. The semiconductor device of claim 9, further comprising:
a normal operation portion suitable for generating a plurality of second operation control signals during a normal operation section in response to an active signal, a pre-charge signal, and bank addresses; and
a row control portion suitable for generating a plurality of row active signals and the idle signal in response to the multiple first and second operation control signals,
wherein the row control portion enables each of the row active signals when one or more of the first and second operation control signals is enabled, and enables the idle signal when the first and second operation control signals are disabled.

11. The semiconductor device of claim 1, wherein the clock-based signal generation block counts the clock when the first operation initiation signal is enabled, and enables the operation termination source signal when a result of counting the clock reaches a predetermined count number.

12. The semiconductor device of claim 1, wherein the clock-based signal generation block generates the operation termination source signal in response to a first operation initiation signal, which is enabled first among the multiple operation initiation signals, and the clock.

13. A semiconductor device, comprising:
an operation initiation control unit suitable for generating a first refresh flag signal in response to a refresh initiation source signal, and an idle signal;
a plurality of first unit delay units suitable for generating a plurality of first delay signals by sequentially delaying the first refresh flag signal at a predetermined time interval;
a first pulse generation unit suitable for sequentially generating a plurality of refresh initiation signals in response to the first refresh flag signal and the multiple first delay signals;
a clock-based signal generation unit suitable for generating a refresh termination source signal in response to a clock, counting codes, and a first refresh initiation signal among the multiple refresh initiation signals;
an operation termination control unit suitable for generating a second refresh flag signal in response to the refresh termination source signal and the idle signal;
a plurality of second unit delay units suitable for generating a plurality of second delay signals by sequentially delaying the second refresh flag signal at the predetermined time interval;
a second pulse generation unit suitable for sequentially generating a plurality of refresh termination signals in response to the second refresh flag signal and the multiple second delay signals; and
an operation control unit suitable for sequentially generating a plurality of refresh control signals in response to the multiple refresh initiation signals and the multiple refresh termination signals.

14. The semiconductor device of claim 13, wherein the predetermined time interval is shorter than a period of the clock.

15. The semiconductor device of claim 13, wherein the first refresh flag signal is enabled during a predetermined refresh operation section, and
the refresh operation section includes an operation section for refreshing a plurality of memory regions.

16. The semiconductor device of claim 15, wherein the multiple first refresh control signals sequentially refresh the multiple memory regions.

17. The semiconductor device of claim 13, further comprising:
a normal operation initiation block suitable for generating a plurality of normal operation initiation signals in response to an active signal and bank addresses;
a normal operation termination block suitable for generating a plurality of normal operation termination signals in response to a pre-charge signal and the bank addresses;
a normal operation control block suitable for generating a plurality of normal operation control signals in response to the multiple normal operation initiation signals and the multiple normal operation termination signals;
a row active signal generation block suitable for generating a plurality of row active signals in response to the multiple refresh control signals and the multiple normal operation control signals, wherein the row active signal generation block enables each of the row active signals when one or more of the refresh control signals and the normal operation control signals is enabled; and
an idle signal generation block suitable for generating the idle signal in response to the multiple row active signals, wherein the idle signal generation block enables the idle signal when the multiple row active signals are disabled.

18. The semiconductor device of claim 13, wherein the clock-based signal generation unit includes a counter.

19. The semiconductor device of claim 13, wherein the clock-based signal generation unit generates the refresh termination source signal in response to a refresh initiation signal, which is enabled first among the multiple refresh initiation signals, the clock, and the counting codes.

* * * * *